June 1, 1965 J. A. EKISS 3,187,197

TRANSISTOR CONTROLLED TUNNEL DIODE SWITCHING NETWORK

Filed June 6, 1961

2 Sheets-Sheet 1

INVENTOR.
JOHN A. EKISS
BY
Herbert Epstein
AGENT

INVENTOR.
JOHN A. EKISS
BY
Herbert Epstein
AGENT 3,187,197

TRANSISTOR CONTROLLED TUNNEL DIODE SWITCHING NETWORK

John A. Ekiss, Lansdale, Pa., assignor, by mesne assignments, to Philco Corporation, Philadelphia, Pa., a corporation of Delaware Filed June 6, 1961, Ser. No. 115,242
12 Claims. (Cl. 307—88.5)

This invention relates to an improved semiconductor switching circuit and to logical networks embodying this switching circuit.

Digital computers used in aircraft and missiles must be small, light and consume a minimum of power. To reduce the size of the computer, its parts must be small and closely packed, e.g. microminiaturized. Under these conditions, the amount of power dissipated as heat by each component of the computer also must be minimized to prevent the ambient temperature within the computer from rising to destructively high values and to minimize the weight and volume of the power source needed to energize the computer.

To reduce the size, heat dissipation and power requirements of computers, transistors have heretofore been substituted for vacuum tubes as the basic switching element thereof. Typically a transitsor switching stage comprises a transistor connected in the common-emitter configuration and developing its output signal across a collector load resistor. Such a switching stage ordinarily is used to drive several other similar switching stages (i.e. a fan-out). A plurality of such switching stages also may be used to control a single other switching stage (i.e. a fan-in). Often a given switching stage is part of a fan-in and also of a fan-out. The fan-out number is the number of switching stages driven by a single switching stage. The fan-in number is the number of switching stages controlling a single other switching stage.

In a typical prior-art transistor logic, e.g. a resistance-coupled logic, a transistor switching stage must be supplied with a relatively large amount of power in order to obtain therefrom an output voltage having adequately fast rise and fall times and sufficient amplitude reliably to switch succeeding stages. This is true even though the given stage is connected in a relatively small fan-in or fan-out. For example, each transistor stage of a resistance-coupled logic in which the sum of the fan-in and fan-out numbers is only six typically consumes at least 15 to 20 milliwatts and as much as 50 to 100 milliwatts. This substantial amount of power, supplied by applying a relatively large operating voltage to the collector load resistor, is mostly dissipated as heat in that resistor. Hence the common-emitter switching circuit is unsuitable for use as a driving stage for other transistor switching stages in those applications in which power consumption and heat dissipation must be minimized.

To obtain a rapidly switchable circuit requiring substantially less power and dissipating substantially less heat than the aforedescribed transistor stage, tunnel diodes have been substituted for transistors as the basic switching element. Typically a tunnel-diode switching stage comprises a tunnel-diode, a load resistor and a source of forward-biasing voltage, all connected in series relationship. The resistor and forward-biasing voltage have values such that the load line representing them intersects both positively-sloped branches of the current-voltage characteristic curve of the tunnel diode.

When the supply voltage is applied, the voltage across the tunnel diode assumes the stable state corresponding to the low-voltage intersection of the load line and the characteristic curve of the diode. The diode is triggered into the alternate, high-voltage stable state by supplying a pulse of triggering current thereto. To return the diode to its low-voltage stable state, the supply voltage must be turned off.

Such a system is disadvantageous for several reasons. In a logic using solely tunnel diodes as switching elements, the values of components and voltages must be held to close tolerances. In addition, because the tunnel diode is a two-terminal device, isolating diodes must be used between successive tunnel diode stages to prevent the state of the driven stage from influencing the operation of the driving stage. In addition, in a computer a multiphase pulse power-supply must be provided for the diodes, which periodically resets each diode to its low-voltage stable state by turning it off.

Accordingly an object of the invention is to provide a semiconductor switching circuit capable of rapid switching even though supplied with only a small amount of power.

Another object is to provide a semiconductor switching circuit capable of driving several transistor switching stages even when supplied with only a small amount of power.

Another object is to provide a semiconductor switching circuit requiring substantially less power than a common-emitter transistor switching stage to switch reliably a fan-out of any given number.

Another object is to provide a semiconductor switching circuit which is particularly well adapted for use in microminiaturized equipment because of its reliable operation in a fan-in or fan-out even when supplied with only a small amount of power and dissipating only a small amount of heat.

Another object is to provide a semiconductor switching circuit capable of operating reliably with only a small power input, which nonetheless is settable to either of two discrete stable states without turning off its supply voltage.

Another object is to provide a switching circuit of the foregoing type, the operation of which does not tend to actuate driving networks connected to its input terminals.

The foregoing objects are achieved in accordance with the invention by a switching circuit comprising a transistor and a tunnel diode. The transistor is connected in the common-emitter configuration—i.e. it has its emitter connected to a point at reference potential and its collector connected to a source of operating voltage by way of an impedance element, e.g. a resistor. One electrode of the tunnel diode is connected to the emitter of the transistor. The other electrode thereof is connected to a source of operating voltage by way of an impedance element, e.g. a resistor. The tunnel diode is poled so as to be forward-biased by its operating voltage. A resistive element connects the collector of the transistor to said other electrode of the tunnel diode.

In operation the conduction state of the transistor is controlled by the value and polarity of a control voltage applied to its base, and this conduction state in turn controls the operating condition of the tunnel diode. In particular it determines which of two discrete, stable states—the high-voltage state or the low-voltage state—the tunnel diode assumes. Thus when the transistor is turned off (conducts substantially no emitter current), the voltage and current supplied to the tunnel diode by the network composed of said impedance elements, resistive element and sources of operating voltage establishes the tunnel diode in its high-voltage stable state. When the transistor is turned on (operates under collector current saturation conditions), it alters the effective values of supply voltage and load resistance of the diode to an extent such that the diode is switched to its low-voltage stable state. Because only a small change in the emitter-collector voltage of the transistor suffices to switch the tunnel diode from one discrete conductive state to the other, the collector operating voltage of the transistor can be considerably lower than is required when the transistor is used directly to switch a plurality of other transistor stages. Since the power dissipation in the transistor stage occurs primarily in this collector load element, and since the power dissipation in this element is approximately proportional to the square of the collector opertaing voltage, the power supplied to the circuit and the heat dissipated by it can be reduced considerably below that needed in transistor stages of prior-art logics. In practice this reduction is so great that the sum of the powers respectively dissipated in the load impedance elements of both the tunnel diode and the transistor is far less than the power dissiptaed solely by the collector resistor of a prior-art stage.

Moreover the decrease in switching speed of the transistor in the novel circuit, caused by lowering its collector voltage, is relatively unimportant insofar as the rise and fall times of the output voltage thereof is concerned. This is so because the tunnel diode switches very rapidly from one stable operating state to the other when the transistor has been turned on (or off) just enough to bias the tunnel diode into the unstable, negative-resistance portion of its characteristic. This switching can occur far more rapidly than the switching of the transistor. Accordingly, since the output signal of the circuit is the change in output voltage across the tunnel diode terminals, the relatively slower operation of the transistor is unimportant.

Although the output voltage of the circuit is small, it is entirely adequate to turn on and off a transistor connected in the common-emitter configuration. In this regard a silicon or gallium arsenide tunnel diode preferably is used to drive a transistor having a germanium base, and a gallium arsenide tunnel diode preferably is used to drive a transistor having a silicon base. Since the output resistance of the switching circuit is low, the stage can drive several such transistor stages even when it is operated with only a small power input. In such an arrangement all of the driven transistor stages are turned on when the switching circuit assumes the other stable state.

In addition, a plurality of switching circuits of the invention may be used in a fan-in to control a single transistor. In such a network, the driven transistor is turned off when all of the switching circuits are in a given one of their two stable states, and turned on when one or more of the switching circuits is in its other conduction state. To prevent one switching circuit from actuating another switching circuit in the fan-in, a diode, poled so as to be non-conductive when the tunnel diode to which it is connected is in its low-voltage state and concurrently another tunnel diode in the fan-in is in its high-voltage state, is connected between the output terminal of each tunnel diode and the load. Backward diodes are particularly well suited for this function because their current-voltage characteristic closely matches that of the tunnel diode.

Other advantages and features of the invention will become apparent from a consideration of the following detailed descripton, taken in connection with the accompanying drawings, in which.

Figure 1:
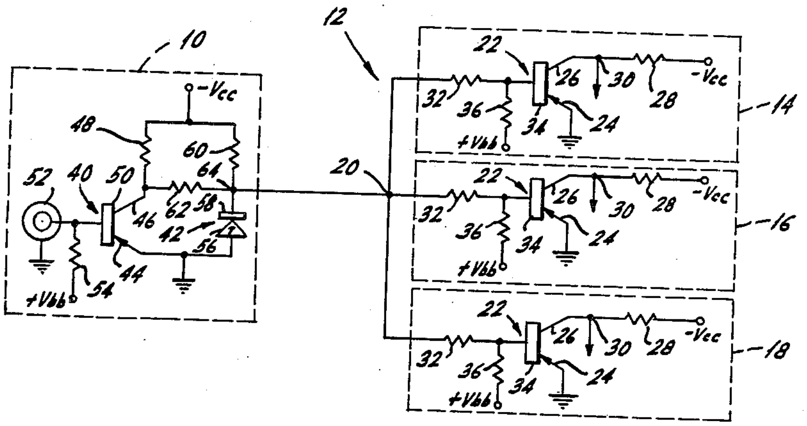
FIGURE 1 is a schematic diagram of a switching circuit and fan-out network according to the invention.

In FIGURE 1, a swithing circuit 10 according to the invention drives a fan-out load 12. Load 12 comprises a plurality of similar networks, e.g. 14, 16 and 18, and an input terminal 20 common to these networks. Each of networks 14, 16 and 18 comprises a transistor 22 of the p-n-p polarity type having its emitter 24 connected to a point at reference potential and its collector 26 connected to a source of operating voltage $-V_{cc}$ by way of an impedance element 28, e.g. a resistor. The junction 30 between collector 26 and resistor 28 is the output terminal of the network. A current-limiting resistor 32 couples the base 34 of each transistor 22 to input terminal 20. To maintain each transistor 22 cut off when switching circuit 10 is in its low output voltage state, a reverse-biasing voltage $+V_{bb}$ is applied to base 34 by way of a resistor 36. When switching circuit 10 is in its high output-voltage state it supplies to terminal 20 a voltage sufficiently negative to drive all transistors into saturation conduction.

Switching circuit 10 comprises a transistor 40, also of the p-n-p polarity type, and a tunnel diode 42. Transistor 40 is connected in the common-emitter configuration—i.e. its emitter 44 is connected to the point at reference potential and its collector 46 is connected to the source of operating voltage $-V_{cc}$ by an impedance element 48, typically a resistor. Base 50 of transistor 40 is supplied with input signals by way of a plug 52. To maintain transistor 40 cut off when no negative input voltage is supplied to its base 50, reverse-biasing voltage $+V_{bb}$ is applied to base 50 via a resistor 54. Tunnel diode 42 has its anode 56 connected to the emitter 44 of transistor 40 and its cathode 58 connected to the source of operating voltage $-V_{cc}$ by way of an impedance element 60, also typically a resistor. So connected, diode 42 is forward biased. A resistive element 62 couples collector 46 of transistor 40 to anode 58 of tunnel diode 42. The junction 64 is the output terminal of the system.

The values of the various components of switching circuit 10 and the operation of the circuit are now discussed with reference to FIGURE 2. In this figure, the axis of abscissas 70 represents voltage negative with respect to reference potential and the axis of ordinates 72 represents current. Curve 74 is the current-voltage characteristic of tunnel diode 42 when diode 42 is forward biased. Line 76 is a load line pertaining to circuit 10 when transistor 40 is cut off. Line 76 has a slope equal to the negative of the reciprocal of the resistance in series with tunnel diode 42 when transistor 40 is cut off, and intersects axis 70 at the supply-voltage value $V_{cc}$. Line 78 is the load line pertaining to circuit 10 when transistor 40 is driven into saturation conduction. Line 78 has a slope equal to the negative of the reciprocal of the resistance effectively in series with tunnel diode 42 when transistor 40 is turned on (i.e. the Thévenin-equivalent resistance looking into the circuit between terminal 64 and the point at reference potential), and intersects axis 70 at $V_0$, the voltage effectively in series with tunnel diode 42 when transistor 40 is turned on (i.e. the corresponding Thévenin-equivalent voltage).

More particularly, tunnel diode characteristic curve 74 is made up of three portions—a first positively-sloped portion 80 extending from the origin to a voltage $V_p$, a negatively-sloped portion 82 extending between the voltages $V_p$ and $V_v$, and a second positively-sloped region 84 extending from the voltage $V_v$ to higher voltages. Tunnel diode 42 can operate stably only when the voltage thereacross lies along either the low-voltage portion 80 or the high-voltage portion 84 of curve 74.

In accordance with the invention, the respective values of resistors 48, 60 and 62 and voltage $-V_{cc}$ are such that the tunnel diode operates at any given time at one of two discrete, stable operating points 86 or 88. In particular, when transistor 40 is turned on, tunnel diode 42 operates at low-voltage point 86 and the output voltage of circuit 10 is $V_1$. When transistor 40 is turned off, diode 42 operates at high-voltage point 88 and the output voltage of the circuit is $V_2$. $V_1$ is selected to be sufficiently low that the transistors 22 of load 12 remain cut off when this voltage is applied to terminal 20. Voltage $V_2$ is selected to be sufficiently high that the transistors 22 of load 12 are all driven into saturation conduction when this voltage is applied to terminal 20.

More particularly, when transistor 40 is turned off, its emitter-collector and base-collector paths have very high impedances—much higher than those of resistors 48 or 62. Accordingly the voltage and resistance connected in series with tunnel diode 42 are respectively $-V_{cc}$ and the quantity $(R_{48}+R_{62})R_{60}/(R_{48}+R_{60}+R_{62})$, where $R_{48}$, $R_{60}$ and $R_{62}$ are the respective ohmic values of resistors 48, 60 and 62. In accordance with the invention, $-V_{cc}$ and resistors 48, 60 and 62 have respective values such that load line 74 representative of them intersects only high-voltage portion 84 of characteristic 74. Under these conditions, tunnel diode 42 has only one stable point 88 of operation and the output voltage of circuit 10 is uniquely $V_2$.

When transistor 40 is turned on, the resistance of its emitter-collector path becomes very low compared to the value of resistor 48 or resistor 62, and this path supplied to the circuit a substantially constant voltage much smaller than $-V_{cc}$. Under these conditions, the Thévenin-equivalent voltage and series resistance supplying tunnel diode 42 are far different from the voltage and series resistance effective when transistor 40 is turned off. The Thévenin-equivalent supply voltage is approximately equal to only $(-R_{62}V_{cc}/R_{60}+R_{62})$, and the Thévenin-equivalent resistance is approximately equal to $$R_{60}R_{62}/(R_{60}+R_{62})$$

This resistance is smaller than the coresponding resistance effective when transistor 40 is turned off. Accordingly load line 78 representative of this voltage and resistance intersects axis 70 at a value $V_0$ far less than $V_{cc}$ and has a steeper slope than load line 76.

In accordance with the invention, the values of $-V_{cc}$ and of elements 48, 60 and 62 are such that the only positively-sloped portion of diode curve 74 intersected by load line 78 is portion 80. Under these conditions, when transistor 40 is on, tunnel diode 42 has only one stable operating point 86 and its output voltage is uniquely $V_1$.

In the foregoing discussion the loading effect of load circuit 12 has been neglected for simplicity. It will be apparent to one skilled in the art how to compensate for this loading effect in the design of circuit 10 so that the aforedescribed mode of operation is obtained.

Figures 2, 3:
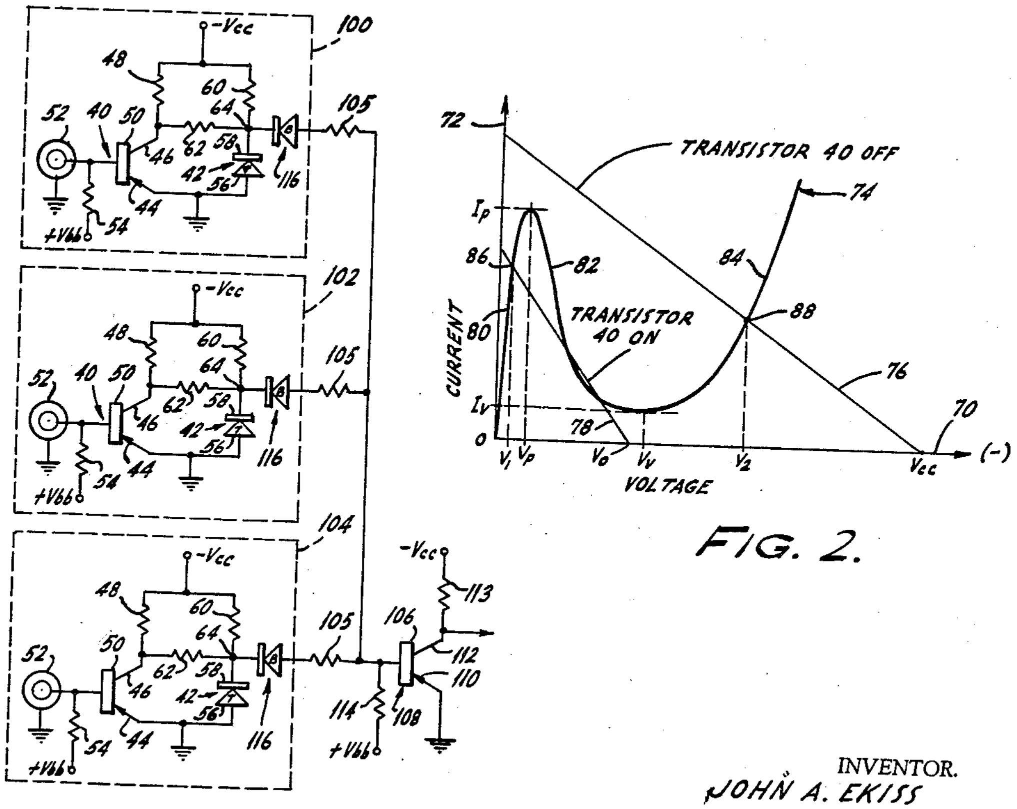
FIGURE 2 is a graph descriptive of the operation of the switching circuit of FIGURE 1.
FIGURE 3 is a schematic diagram of a fan-in network of the invention.

FIGURE 3 illustrates a logic circuit comprising a plurality of switching circuits according to the invention, e.g. 100, 102 and 104, each having its output terminal 64 connected by a coupling resistor 105 to the base 106 of a transistor 108. Transistor 108 is connected in the common-emitter configuration—its emitter 110 is connected to a point at reference potential and its collector 112 is connected to a source of operating voltage $-V_{cc}$ by a resistor 113. To maintain transistor 108 cut off when all switching circuits 100, 102 and 104 are in the low output voltage state, base 106 is supplied with a reverse-biasing voltage $+V_{bb}$ by way of a resistor 114. When any of switching circuits 100, 102, 104 is actuated into its high output voltage state, e.g. by applying an appropriate input voltage to its terminal 52, transistor 108 is turned on by the high-voltage output signal.

The high-voltage output signal of any one of switching circuits 100, 102, 104 is capable not only of turning on transistor 108 but also of actuating the tunnel diode 42 of any other of these switching circuits into its high output voltage state. Such operation is undesirable because it prevents the several switch circuits from functioning independently of one another. In accordance with the invention, this undesirable interaction between switching circuits is prevented by inserting an isolating diode 116 in series relationship with each coupling resistor 105, e.g. between output terminal 64 and resistor 105. Each diode 116 is poled so as to be biased into its low-resistance condition when all switching circuits 100, 102, and 104 are in the same conduction state, and into its high-resistance condition when the switching circuit to which it is connected is in its low-voltage state and concurrently another of the switching circuits is in its high-voltage state. When the diodes are all so poled no one switching circuit can transmit to another of these switching circuits an output signal which differs from that of said other circuit. Hence each switching circuit can operate unaffected by the operation of the others.

Figure 4:
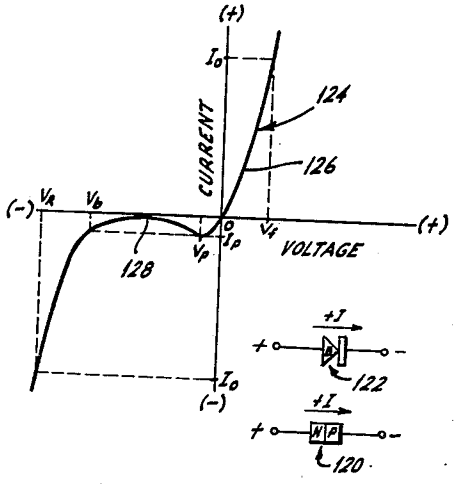
FIGURE 4 shows the current-voltage characteristic of a backward diode and the polarity convention used herein in describing these diodes.

Preferably each diode 116 is a "backward diode," because such a diode can be switched from a low-resistance state to a high-resistance state by a change of less than 100 millivolts in its terminal voltage. This sensitivity to small changes in applied voltage is desirable in switching circuits according to the invention because the change in output voltage of each tunnel diode between its low and high-voltage states typically is only about 500 millivolts. Because the backward diode is a relatively new device, its characteristics are now discussed briefly herein with reference to FIGURE 4.

The device is termed a backward diode because, for small terminal voltages, it exhibits a low resistance when the n-type element of the diode is biased positive with respect to the p-type element, and a high resistance when this polarity is reversed. This behavior is opposite that of conventional diodes and is diagrammatically indicated in FIGURE 4 at 120. The diagram at 122 shows the sign convention used herein with respect to the backward diode. The graph 124 depicts the current-voltage characteristic of the diode. The low-resistance, first-quadrant portion 126 of this characteristic represents the operation of the diode when its n-type element is biased positive with respect to its p-type element. For a typical germanium backward diode, $I_0$ is one milliampere when $V_f$ is only about 100 millivolts. The high-resistance third-quadrant portion 128 of this characteristic represents the operation of the diode when its n-type element is biased negative with respect to its p-type element. For a typical garmanium backward diode, $I_p$ is only about 100 microamperes when $V_p$ is 60 millivolts. $V_b$ is over 400 millivolts and $V_R$, the voltage for which $-I_0$ is one milliampere, is about 500 millivolts. To take advantage of the high resistance portion of curve 128, the switching circuits and load circuit are designed so that the reverse-biasing voltage applied across diode 116 is less than $V_b$.

Figure 5:
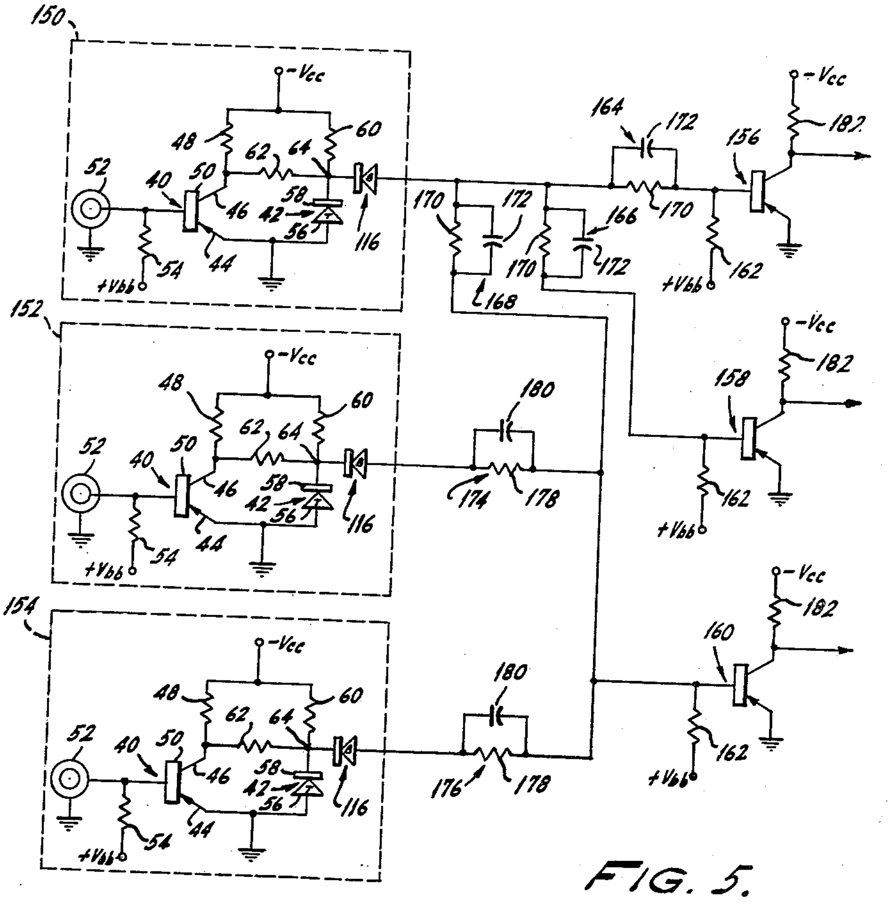
FIGURE 5 is a schematic diagram of a composite logic circuit employing switching circuits according to the invention.

FIGURE 5 illustrates a logical network comprising a plurality of switching circuits 150, 152, 154 according to the invention connected in both fan-in and fan-out configurations to three load transistors 156, 158 and 160. Each load transistor is connected in the common-emitter configuration, and its base is supplied with reverse-biasing voltage $+V_{bb}$ via a resistor 162 as described hereinbefore. Switching circuit 150 has a fan-out of three—it is connected to the bases of the three transistors 156, 158 and 160 by coupling networks 164, 166 and 168 respectively. Each coupling network comprises a resistor 170 and a speed-up capacitor 172. Load transistor 160 has a fan-in of three—the outputs of all three switching circuits are coupled to its base. In this regard networks 174 and 176 couple switching circuits 152 and 154 respectively to the base of transistor 160. Each comprises a resistor 178 and a capacitor 180.

When switching circuits 150, 152 and 154 are all in the low output-voltage state, all of load transistors 156, 158 and 160 are turned off. When switching circuit 150 is in its high output-voltage state, all three load transistors are turned on. When circuit 150 is in its low output-voltage state and circuit 152 or circuit 154 is in its high output-voltage state, only load transistor 160 is turned on.

A typical set of component values for the arrangement of FIGURE 5 is the following:

| | |
|---|---|
| Transistors **40**, **156**, **158** and **160** | each a Philco Type 2N768 germanium microalloy difused-base transistor, p-n-p-polarity. |
| Tunnel diode **42** | a germanium diode having the following characteristics: $I_p$ between 0.99 and 1.04 milliamperes; $I_v$ between 0.28 and 0.47 milliamperes; $V_p$ between 85 and 115 millivolts; $V_v$ between 300 millivolts and 360 millivolts. |
| $V_{cc}$ | 1.5 volts. |
| $V_{bb}$ | 1.5 volts. |
| Resistors **48** and **182** | each 680 ohms. |
| Resistors **54** and **162** | each 15,000 ohms. |
| Resistor **60** | 2700 ohms. |
| Resistor **170** | 4700 ohms. |
| Resistor **178** | 1500 ohms. |
| Speed-up capacitors **172** and **180** | each 910 picofarads. |
| Backward diode **116** | Philco Type T1977, having the following characteristics: $V_f$, 0.100 volt maximum for an $I_0$ of 1 milliampere; $V_R$ 0.460 volts minimum for a minus $I_0$ of 1 milliampere; $I_p$ 100 microamperes maximum. |

When the circuit of FIGURE 5 has the foregoing parameters, the time required to turn on load transistors 156, 158 and 160 is under 100 nanoseconds. The turn-off times of these transistors is between 40 to 50 nanoseconds. The average power dissipation per stage of the network of FIGURE 5 is only about four milliwatts. By contrast the typical power dissipation per stage in a resistance-coupled transistor logic performing the same operation as the system of FIGURE 5 is 30 milliwatts or more.

The invention obviously is not limited to a circuit having the foregoing specific parameter values. The parameter values will vary in accordance with the specific configuration of the logic circuit and the types of transistors and tunnel diodes used, in a manner apparent to those skilled in the art.

All of the various circuits specifically described above comprise transistors of the p-n-p polarity type. However transistors of the n-p-n type may be substituted therefor. Where such a substitution is made it is only necessary to reverse the polarities of all voltages shown and to reverse the poling of the tunnel diode and backward diode in the circuit.

In all circuits, impedance elements 48 and 60 and resistive element 62 have been described as resistors. However, all of these elements may comprise reactive elements. For example, to improve the transient response of the system, impedance elements 48 and 60 may comprise peaking inductors having an appreciable resistance and resistive element 62 may comprise a resistor shunted by a speed-up capacitor.

While I have described my invention by reference to specific embodiments, I do not wish to be limited thereto, for obvious modifications will occur to those skilled in the art without departing from the scope of my invention.

I claim:

1. A switching circuit comprising: a transistor having an emitter, a collector and a base; a first impedance element connected to said collector, means for impressing an operating voltage between said emitter and a terminal of said first impedance element remote from said collector, a tunnel diode having first and second electrodes, a second impedance element connected to said first electrode of said tunnel diode, means for impressing an operating voltage between said second electrode of said tunnel diode and a terminal of said second impedance element remote from said first electrode of said tunnel diode, a resistive element connected between said collector and said first electrode of said tunnel diode, means coupling said emitter directly to said second electrode of said tunnel diode, means for supplying a switching signal to said base and means for deriving an output signal from said first electrode of said tunnel diode.

2. A switching circuit according to claim 1, wherein said tunnel diode is poled so that it is forward biased.

3. A switching circuit according to claim 2, wherein said tunnel diode when forward biased operates stably only when the voltage between said electrodes is either less than a first value or greater than a second value exceeding said first value, and wherein said operating voltages, said impedance elements and said resistive element have respective values such that when said transistor is substantially cut off, said voltage between said electrodes is greater than said second value, and when said transistor is driven into saturation, said voltage between said electrodes is less than said first value.

4. A switching circuit according to claim 2, wherein each of said impedance elements is direct-current conductive.

5. A switching circuit according to claim 2, wherein each of said impedance elements is a resistor.

6. A switching circuit according to claim 2 wherein said means for deriving an output signal from said first electrode includes a backward diode connected to said first electrode of said tunnel diode, the terminal of said tunnel diode remote from said first electrode forming an output terminal of said switching circuit.

7. A switching circuit comprising: a transistor having an emitter, a collector and a base, a tunnel diode having two electrodes, means connecting said emitter directly to one of said tunnel diode electrodes, a resistor connecting said collector to a first terminal of a source of operating voltage, means connecting said emitter to a second terminal of said source of operating voltage, a resistor connecting the other of said tunnel diode electrodes to said first terminal of said source of operating voltage, a resistor coupling said collector to said other tunnel diode electrode, said tunnel diode being poled so as to be forward biased, said tunnel diode when forward biased being adapted to operate stably only when the voltage thereacross is either less than a first value or greater than a second value exceeding said first value, and said operating voltages and said resistors having respective values such that when said transistor is substantially cut off, said voltage across said tunnel diode is greater than said second value and when said transistor is driven into saturation, said voltage across said tunnel diode is less than said first value, means for supplying a switching signal to said base and means for deriving an output signal from said other electrode of said tunnel diode.

8. In combination: a switching circuit comprising a transistor having an emitter, a collector and a base, a tunnel diode having two electrodes, an impedance element connecting said collector to a first terminal of a source of operating voltage, an impedance element connecting one of said tunnel diode electrodes to said first terminal of said source of operating voltage, means connecting said emitter and the other of said tunnel diode electrodes to a point at reference potential which is also a second terminal of said source of operating voltage, a resistive element coupling said collector to said one electrode and means for supplying a switching signal to said base; a load comprising a plurality of networks and an input terminal common to said networks, each of said networks comprising a transistor amplifier stage including a transistor having an emitter, a collector and a base, and resistive means connecting the latter base to said input terminal; and means connecting said one terminal of said tunnel diode to said input terminal of said load.

9. A combination according to claim 8, wherein said transistors are of the same conductivity type, said tunnel diode is poled so that it is forward biased, and each of said networks additionally comprises means connecting said emitter of said network transistor to said point at reference potential and a resistive element connecting the collector of said network transistor to a source of operating voltage.

10. In combination: a plurality of similar networks and a common load therefor, said load comprising a transistor amplifier stage including a transistor having an emitter, a collector and a base, each of said networks comprising a switching circuit and means for coupling said switching circuit to said base, said switching circuit comprising a transistor having an emitter, a collector and a base, means for supplying a switching signal to said base, a tunnel diode having two electrodes, an impedance element connecting the last-named collector to a first terminal of a source of operating voltage, an impedance element connecting one of said tunnel diode electrodes to said first terminal of said source of operating voltage, means connecting the last-named emitter and the other of said tunnel diode electrodes to a point at reference potential which is also a second terminal of said source of operating voltage and a resistive element coupling the last-named collector to said one electrode, and each of said coupling means connecting said one tunnel diode electrode of its network to said base of said load transistor and comprising a backward diode poled so as to prevent actuation of said switching circuit of its network by signals supplied to said base of said load transistor by another of said networks.

11. A combination according to claim 10, wherein said bases of all said transistors are of the same conductivity type, each of said impedance elements of said switching circuit is a resistive element, said tunnel diode is poled so that it is forward biased, said load additionally comprises means connecting said emitter of said load transistor to said point at reference potential and a resistive element connecting said collector of said load transistor to a source of operating voltage, and each of said coupling means comprises said backward diode and a resistive element connected serially between said base of said load transistor and said one electrode of said tunnel diode forming part of the same network as said coupling means.

12. A combination according to claim 11, wherein said backward diode of each of said networks is poled so as to be reverse-biased whenever said tunnel diode in the one of said networks comprising said backward diode is in its low output-voltage state and concurrently said tunnel diode of another of said networks is in its high output-voltage state.

References Cited by the Examiner

UNITED STATES PATENTS

| | | | |
|---|---|---|---|
| 2,870,348 | 1/59 | Chao | 307—88.5 |

OTHER REFERENCES

Neff: I.B.M. Technical Disclosure Bulletin, vol. 3, No. 5, Nov. 1960 (pages 46, 47).

Lesk et al.: "The Tunnel Diode . . .," Electronics, Nov. 27, 1959, (pages 60 to 64).

General Electric Tunnel Diode Manual, Mar. 20, 1961, (pages 43 and 56).

Hurley: Junction Transistor Electronics, 2nd Printing, 1959, Wiley & Sons (page 384).

Pressman: Design of Transistorized Circuits for Digital Computers, John J. Rider, N.Y., 1959, page 9–227.

ARTHUR GAUSS, *Primary Examiner.*

GEORGE N. WESTBY, *Examiner.*